(12) United States Patent
Yoon et al.

(10) Patent No.: US 12,123,916 B2
(45) Date of Patent: Oct. 22, 2024

(54) APPARATUS AND METHOD FOR MANAGING BATTERY

(71) Applicant: LG Energy Solution, Ltd., Seoul (KR)

(72) Inventors: Ho Byung Yoon, Daejeon (KR); Young Hwan Kim, Deajeon (KR); Hu Jun Lee, Daejeon (KR); Jeong Wan Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 338 days.

(21) Appl. No.: 17/623,654

(22) PCT Filed: Jul. 28, 2020

(86) PCT No.: PCT/KR2020/009896
§ 371 (c)(1),
(2) Date: Dec. 29, 2021

(87) PCT Pub. No.: WO2021/020852
PCT Pub. Date: Feb. 4, 2021

(65) Prior Publication Data
US 2022/0291287 A1    Sep. 15, 2022

(30) Foreign Application Priority Data
Jul. 29, 2019    (KR) .................. 10-2019-0091980

(51) Int. Cl.
*G01R 31/382*    (2019.01)
*B60L 58/13*    (2019.01)
(Continued)

(52) U.S. Cl.
CPC ............ *G01R 31/382* (2019.01); *B60L 58/13* (2019.02); *B60L 58/16* (2019.02); *G01R 31/392* (2019.01)

(58) Field of Classification Search
CPC ..... G01R 31/382; G01R 31/392; B60L 58/16; B60L 58/13
See application file for complete search history.

(56) References Cited

U.S. PATENT DOCUMENTS

2004/0001996 A1    1/2004 Sugimoto
2005/0035741 A1*   2/2005 Elder ................ H01M 10/0413
                                                        320/116
(Continued)

FOREIGN PATENT DOCUMENTS

CN    102119338 A    7/2011
JP    H08196940 A    8/1996
(Continued)

OTHER PUBLICATIONS

International Search Report for PCT/KR2020/009896 dated Nov. 6, 2020. 3 pgs.
(Continued)

*Primary Examiner* — Elias Desta
(74) *Attorney, Agent, or Firm* — Lerner David LLP (57) ABSTRACT

A battery management apparatus includes an SOC calculation unit to calculate an SOC of a battery module by using at least one of voltage, current, or temperature measured for the battery module in which a plurality of battery cells are connected in parallel, an SOH calculation unit to calculate an SOH of the battery module based on at least one of the SOC calculated by the SOC calculation unit and the voltage, current, or temperature of the battery module, and a diagnosis unit to calculate a change rate of an SOH using the SOH, and diagnose a state of the battery module using the calculated SOH change rate. The state of the battery module is any one of a normal state, a state including a degenerate battery cell, or a state including a current interrupt device (CID) open battery cell.

13 Claims, 5 Drawing Sheets

(51) Int. Cl.
  *B60L 58/16*     (2019.01)
  *G01R 31/392*    (2019.01)

(56) References Cited

U.S. PATENT DOCUMENTS

| | | | |
|---|---|---|---|
| 2006/0152224 A1* | 7/2006 | Kim | G01R 31/392 |
| | | | 324/430 |
| 2010/0036626 A1 | 2/2010 | Kang et al. | |
| 2010/0097033 A1* | 4/2010 | Tange | H02J 7/0014 |
| | | | 320/134 |
| 2011/0112781 A1 | 5/2011 | Anderson et al. | |
| 2012/0035873 A1 | 2/2012 | Kang et al. | |
| 2012/0119749 A1 | 5/2012 | Iida | |
| 2012/0256569 A1 | 10/2012 | Kawahara et al. | |
| 2013/0069598 A1 | 3/2013 | Tanaka et al. | |
| 2013/0088201 A1 | 4/2013 | Wasawa et al. | |
| 2014/0335387 A1 | 11/2014 | Takahashi et al. | |
| 2016/0028254 A1 | 1/2016 | Honoki et al. | |
| 2017/0279288 A1 | 9/2017 | Kimura et al. | |
| 2018/0217208 A1 | 8/2018 | Park et al. | |

FOREIGN PATENT DOCUMENTS

| | | |
|---|---|---|
| JP | 2792294 B2 | 9/1998 |
| JP | 2004031120 A | 1/2004 |
| JP | 4622583 B2 | 2/2011 |
| JP | 2013153606 A | 8/2013 |
| JP | 2013191355 A | 9/2013 |
| JP | 2014117021 A | 6/2014 |
| JP | 2015056354 A | 3/2015 |
| JP | 5994240 B2 | 9/2016 |
| JP | 2017211262 A | 11/2017 |
| JP | 6394631 B2 | 9/2018 |
| JP | 6461684 B2 | 1/2019 |
| KR | 20060014903 A | 2/2006 |
| KR | 20180084523 A | 7/2018 |
| WO | 2013114468 A1 | 8/2013 |
| WO | 2014147973 A1 | 9/2014 |

OTHER PUBLICATIONS

Extended European Search Report including Written Opinion for Application No. 20846850.4 dated Aug. 3, 2022, pp. 1-6.

* cited by examiner

APPARATUS AND METHOD FOR MANAGING BATTERY

CROSS-REFERENCE TO RELATED APPLICATIONS

The present application is a national phase entry under 35 U.S.C. § 371 of International Application No. PCT/KR2020/009896 filed Jul. 28, 2020, published in Korean, which claims priority from 10-2019-0091980 filed Jul. 29, 2019, all of which are incorporated herein by reference.

TECHNICAL FIELD

Mutual Citation with Related Applications

The present invention claims the benefit of priority based on Korean Patent Application No. 10-2019-0091980 filed on Jul. 29, 2019, and includes all contents disclosed in the documents of the Korean patent application as part of this specification.

Technical Field

The present invention relates to a battery management apparatus and a management method for diagnosing a battery condition using SOH of a battery module.

Background Art

Recently, research and development on secondary batteries have been actively conducted. Here, the secondary batteries, as batteries that can be charged and discharged, mean that they include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery, and further, the lithium ion battery can be manufactured with a tendency of a small size so that it is used as a power source for a mobile apparatus. The usage range of such a lithium ion battery extends as a power source for electric vehicles, so that the lithium ion battery attracts attention as a next generation energy storage medium.

In addition, a secondary battery is generally used as a battery pack including a battery module in which a plurality of battery cells are connected in series and/or in parallel. A state and an operation of such a battery pack are managed and controlled by a BATTERY MANAGEMENT SYSTEM (BMS).

In general, in the case of an electric vehicle, since high energy is required to improve the driving distance, battery cells are connected in parallel to increase capacity. In particular, in the case of a cylindrical secondary battery (18650 or 21700 cells), a larger number of cells need to be connected in parallel because the cell amount is smaller than that of a medium-large cell (a pouch or a square).

It is practically impossible to monitor the state of all cells in BMS so that voltage is measured in units of modules including cells connected in parallel and the state of the battery (state of charge (SOC) and state of health (SOH)) is estimated.

In the case of cylindrical cells, when gas is generated inside the cell due to overvoltage or overcurrent, CURRENT INTERRUPT DEVICE (CID), which cuts off the cell's electrical connection and releases gas, is sometimes operated. In this case, the electrical connection of one of the cells connected in parallel is cut off, so that the SOH value of the module including the cell changes. Also, the SOH value of the module including the cell changes due to deterioration of the battery cell. Therefore, it was not possible to know only with the related art whether the capacity was reduced due to the deterioration of the battery cells in the battery module or the capacity was decreased due to the CID operation.

If this is not clearly known, as an overload (increased current) occurs in the disconnected cell and the parallel connected cells, safety issues occur or cell degeneration proceeds quickly, thereby causing a decrease in battery performance.

SUMMARY

Technical Problem

An object of the present invention is to diagnose the cause of a capacity reduction by using an SOH change amount of a battery module in order to solve the above-described problem.

Technical Solution

In order to solve the above technical problems, a battery management apparatus according to embodiments of the present disclosure includes: memory including one or more programs; and a controller configured process the one or more programs of the memory to: calculate a state of charge (SOC) of a first battery module based on at least one of a measured voltage, a measured current, or a measured temperature of the first battery module, wherein the first battery module includes a plurality of battery cells connected in parallel; calculate a state of health (SOH) of the first battery module based on at least one of the calculated SOC the measured voltage, the measured current, or the measured temperature of the first battery module; calculate an SOH change rate of the SOH; and diagnose a state of the first battery module based on the calculated SOH change rate, wherein the state of the first battery module is any one of a normal state, a state including a degenerate battery cell, or a state including a current interrupt device (CID) open battery cell.

In the battery management apparatus according to embodiments of the present disclosure, the controller may be configured to an SOC of each of a plurality of battery modules including the first battery module based on at least one of a respective voltage, current, or temperature of each of the plurality of battery modules, calculate an SOH of each of the plurality of battery modules based on a respective SOC of each of the plurality of battery modules, and diagnose the state of at least one battery module of the plurality of battery modules by comparing the respective SOH change rates of the plurality of battery modules.

In the battery management apparatus according to embodiments of the present disclosure, the controller may be configured to diagnose the state of the at least one battery module by comparing a preset value with the SOH change rate of other ones of the plurality of battery modules with respect to the SOH change rate of the at least one battery module among change rates of each SOH of the plurality of battery modules during a predetermined time.

In the battery management apparatus according to embodiments of the present disclosure, the controller may be configured to diagnose the at least one battery module as including a degenerate battery cell in response to the SOH change rate of the at least one battery module being greater than a first preset value and less than a second preset value, as opposed to the SOH change rate of the other ones of the plurality of battery modules, the diagnosis unit; diagnose the at least one battery module as including a CID open battery cell in response to an SOH reduction rate of the at least one battery module being (1/number of battery cells in the battery module)*100% or more; and diagnose the at least one battery module as being in a normal state in response to the at least one battery module not including a degenerate battery cell or including a CID open battery cell.

The memory of the battery management apparatus according to embodiments of the present disclosure may further be configured to store each respective SOH value calculated for the plurality of battery modules.

The battery management apparatus according to embodiments of the present disclosure may further include a communication interface to transmit a diagnosis result to an upper-level system in response to the at least one battery module being diagnosed as including a degenerate battery cell or including a CID open battery cell.

In order to solve the above technical problems, a battery management method according to embodiments of the present disclosure includes: calculating an SOC of a first battery module based on at least one of a measured voltage, a measured current, or a measured temperature of the first battery module, wherein the first battery module includes a plurality of battery cells connected in parallel; calculating an SOH of the first battery module based on at least one of the calculated SOC, the measured voltage, the measured current, or the measured temperature of the first battery module; calculating an SOH change rate of the SOH of the battery module; and diagnosing a state of the first battery module based on the calculated SOH change rate, wherein the state of the first battery module is any one of a normal state, a state including a degenerate battery cell, or a state including a CID open battery cell.

The battery management method according to embodiments of the present disclosure may further include calculating an SOC of each of a plurality of battery modules including the first battery module based on at least one of a respective voltage, current, or temperature of each of the plurality of battery modules; and calculating a respective SOH change rate of each of the calculated SOHs.

The battery management method according to embodiments of the present disclosure may further include diagnosing the state of at least one battery module of the plurality of battery modules by comparing the respective SOH change rates of the plurality of battery modules.

In the battery management method according to embodiments of the present disclosure, the diagnosing of the state of the at least one battery module may include: diagnosing the at least one battery module as including a degenerate battery cell in response to the SOH change rate of the at least one battery module being greater than a first value and less than a second value, as opposed to the SOH change rate of other ones of the plurality of battery modules; diagnosing the at least one battery module as including a CID open battery cell in response to an SOH reduction rate of the at least one battery module being (1/number of battery cells in the battery module)*100%; and diagnosing the at least one battery module as being in a normal state in response to the at least one battery module not including a degenerate battery cell or including a CID open battery cell.

The battery management method according to embodiments of the present disclosure may further include storing each SOH value calculated for the plurality of battery modules.

The battery management method according to embodiments of the present disclosure may further include transmitting a diagnosis result to an upper-level system in response to the state of the at least one battery module being diagnosed as including a CID open battery cell.

The battery management method according to embodiments of the present disclosure may further include transmitting a diagnosis result to an upper-level system in response to the state of the at least one battery module being diagnosed as including a degenerate battery cell and a number of corresponding diagnosis results being greater than or equal to a preset number.

Advantageous Effects

The present invention has an effect of improving battery efficiency and safety by diagnosing the cause of capacity reduction using an SOH change amount of a battery module in order to solve the above-described problem.

DETAILED DESCRIPTION

Hereinafter, various embodiments of the present invention will be described in detail with reference to the accompanying drawings. In this document, the same reference numerals are used for the same components in the drawings, and duplicate descriptions for the same components are omitted.

For various embodiments of the present invention disclosed in this document, specific structural or functional descriptions are exemplified only for the purpose of explaining an embodiment of the present invention, and various embodiments of the present invention may be implemented in various forms and should not be construed as being limited to the embodiments described in this document.

The terms such as "1st", "2nd", "first", "second", and the like used herein may refer to modifying various different elements of various embodiments of the present disclosure, but do not limit the elements. For example, a first component may be referred to as a second component and vice versa without departing from the technical scope of the present invention.

Terms used herein is for the purpose of describing particular example embodiments only and is not intended to be limiting of the scope of other embodiments. The terms of a singular form may include plural forms unless they have a clearly different meaning in the context.

Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood as having an ideal or excessively formal meaning. In any cases, even the terms defined in this specification cannot be interpreted as excluding embodiments of the present invention.

Figure 1:
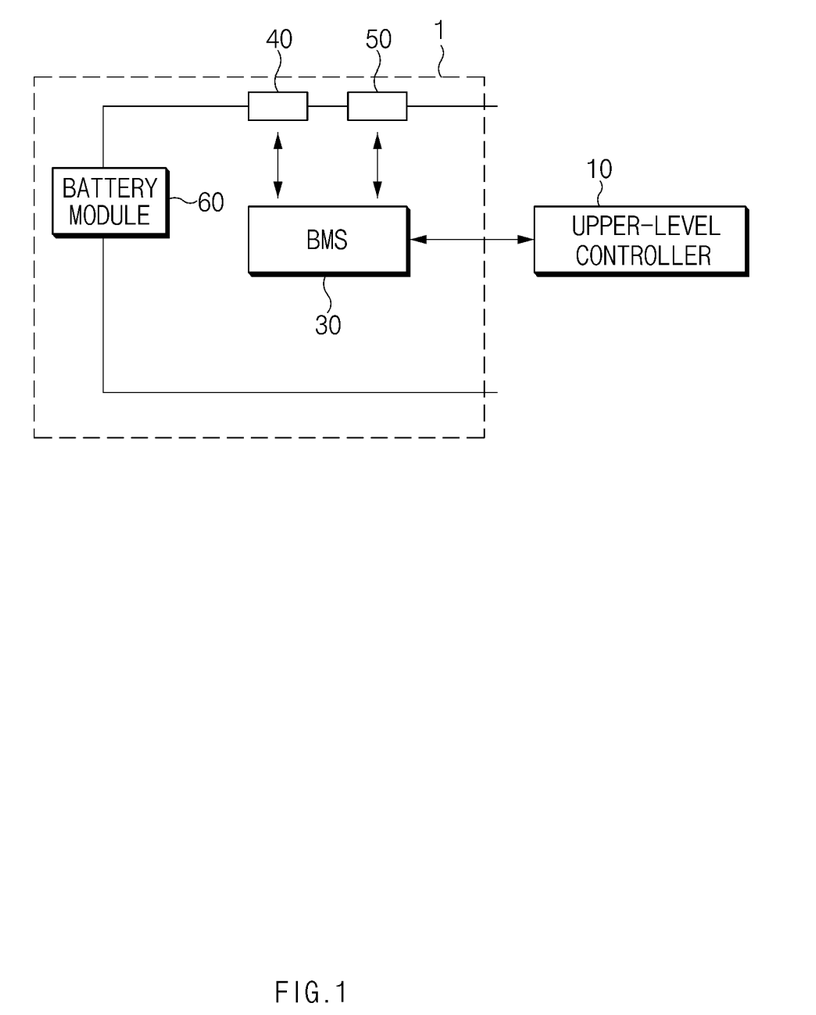
FIG. 1 is a block diagram showing a battery management system and an upper-level system.

FIG. 1 is a block diagram showing a battery management system and an upper-level system.

A battery pack 1 includes a battery module 60 composed of one or more battery cells and capable of being charged and discharged, a switching unit 50 connected in series to the +terminal side or the −terminal side of the battery module 60 to control the charge/discharge current flow of the battery module 60, and a BMS 30 that monitors the voltage, current, temperature, and the like of the battery module 60 to control and manage it so as to prevent overcharge and overdischarge.

Here, the switching unit 50 is a semiconductor switching element for controlling the current flow for the charge or discharge of the battery module 60, and for example, at least one MOSFET may be used. It will be readily understood by those skilled in the art that a relay or a contactor may be used as the switching unit 50 in addition to the semiconductor switching element.

In addition, in order to monitor the voltage, current, temperature, etc. of the battery module 60, the BMS 30 can measure or calculate voltages and currents of gates, sources, and drains of semiconductor switching elements, and in addition, can measure the current, voltage, temperature, etc. of the battery module using the sensor 40 provided adjacent to the semiconductor switching element. The BMS 30 is an interface for receiving the values obtained by measuring the above-described various parameters, and may include a plurality of terminals and a circuit that is connected to these terminals and processes the received values.

In addition, the BMS 30 may control ON/OFF of the MOSFET and may be connected to the battery module 60 to monitor the state of the battery module 60.

Since the configuration of the battery rack 1 and the configuration of the BMS 30 are known configurations, more detailed description thereof will be omitted.

On the other hand, the BMS 30 according to the embodiments of the present invention is connected to the upper-level controller 10, and the operation may be controlled based on a signal applied from the upper-level controller 10.

Figure 2:
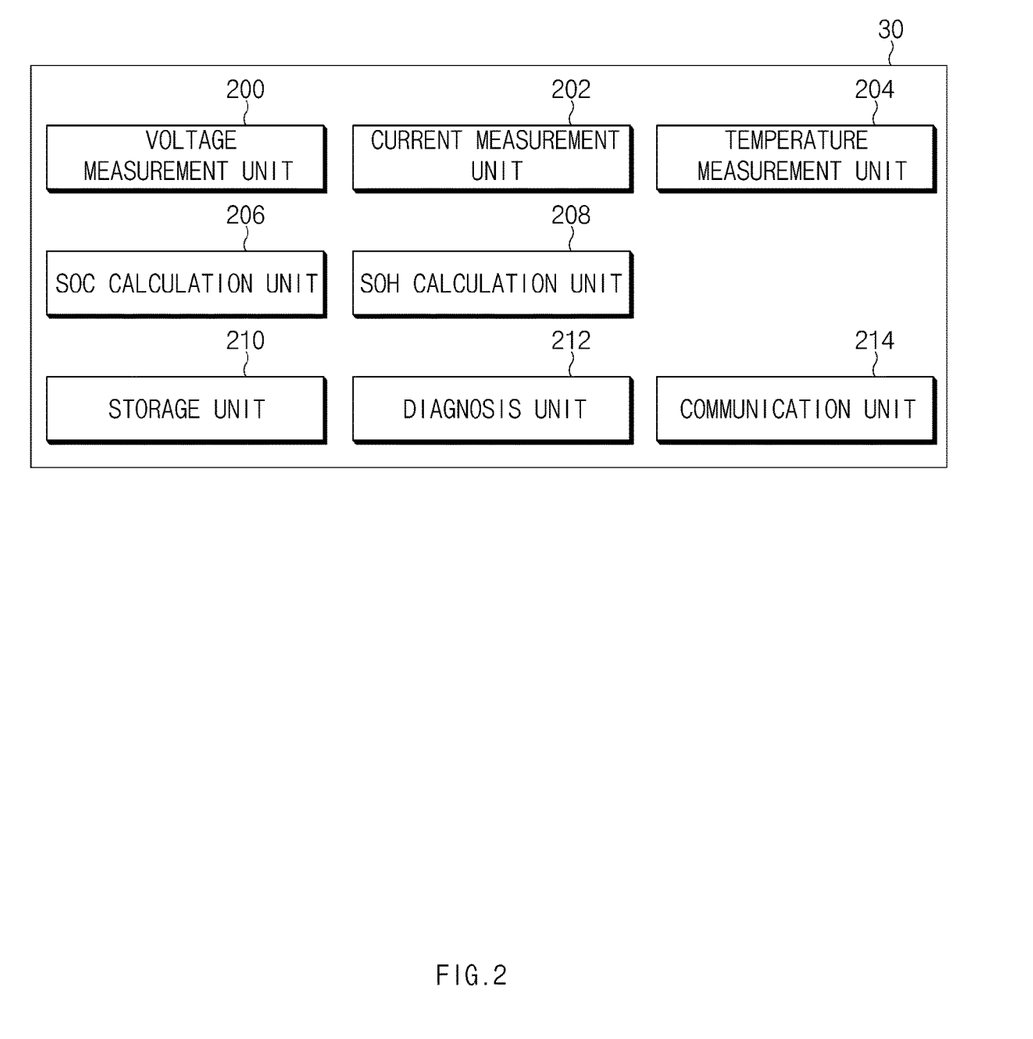
FIG. 2 is a configuration diagram showing a configuration of a battery management apparatus.

FIG. 2 is a configuration diagram of a battery management apparatus 30 (battery management system). Although the battery management system 30 of FIG. 1 is shown to be connected to one battery module, the battery management apparatus 30 of the present invention may be connected to a plurality of battery modules.

The battery management apparatus 30 includes a voltage measurement unit 200, a current measurement unit 202, a temperature measurement unit 204, an SOC calculation unit 206, an SOH calculation unit 208, a storage unit 210, a diagnosis unit 212, and a communication unit 214.

The voltage measurement unit 200 measures the voltage at both ends of the battery module. In general, there is a method of measuring a battery voltage, for example, a method of using an operational amplifier and a method of using a relay and a capacitor.

The current measurement unit 202 measures the current of the battery module. In general, battery current measurement may be performed using a current sensor corresponding to at least one of a current transformer method, a hall element method, and a fuse method.

The temperature measurement unit 204 measures the temperature of the battery module. In general, the battery temperature measurement unit may be, for example, a thermistor. A thermistor is a semiconductor element obtained by mixing and sintering oxides such as manganese, nickel, copper, cobalt, chromium, and iron, and is an element having a characteristic in which an electrical resistance value changes depending on temperature. For example, the thermistor may be any one of the elements of a positive temperature coefficient (PTC) thermistor whose temperature and resistance values are proportional, a negative temperature coefficient (NTC) thermistor whose temperature and resistance values are inversely proportional, and a critical temperature resistor (CTR) whose resistance value changes rapidly at a specific temperature.

The SOC calculation unit 206 receives the voltage value of the battery module measured from the voltage measurement unit 200. The SOC calculation unit 206 receives the current value of the battery module measured from the current measurement unit 202. The SOC calculation unit 206 receives the measured temperature value of the battery module from the temperature measurement unit 204.

The SOC calculation unit 206 calculates the SOC of the battery module using at least one of voltage, current, or temperature of the battery module. In general, the battery SOC displays the remaining amount of the battery's full charge capacity as a percentage. SOC estimation methods include a current integration method, a method using an EXTENDED KALMAN FILTER, an electric circuit model method, an electrochemical model method, and a data-based method. The SOC calculation unit 206 calculates each SOC for a plurality of battery modules. That is, the SOC calculation unit 206 calculates the SOC of the battery module by using at least one of the measured voltage, current, or temperature of a battery module in which a plurality of battery cells are connected in parallel.

The SOH calculation unit 208 receives the voltage value of the battery module measured from the voltage measurement unit 200. The SOH calculation unit 208 receives the current value of the battery module measured from the current measurement unit 202. The SOH calculation unit 208 receives the measured temperature value from the temperature measurement unit 204. The SOH calculation unit 208 receives the SOC value of the battery module calculated from the SOC calculation unit 206. In addition, the SOH calculation unit 208 also calculates the SOH for each of the plurality of battery modules using voltage values, current values, temperature values, and SOCs for each of the plurality of battery modules.

SOH represents the degree of deterioration of battery capacity due to aging. SOH can be used to adjust the charging/discharging capacity according to the battery replacement time and battery usage period. SOH estimation methods include a method of integrating battery charge/discharge current and a method of estimating using the estimated SOC, and in the present invention, a method of estimating an SOH using an SOC is used. A specific method is a known technique and a detailed description thereof will be omitted.

The storage unit 210 receives the SOH values calculated for the plurality of battery modules in real time from the SOH calculation unit 208. The storage unit 210 stores the received SOH of each of the plurality of battery modules.

The diagnosis unit 212 receives SOH information of each of the plurality of battery modules from the storage unit 210. The diagnosis unit 212 calculates the change rate of an SOH of each of the plurality of battery modules, and diagnoses the state of the battery module using the calculated rate of change of an SOH.

Figure 3:
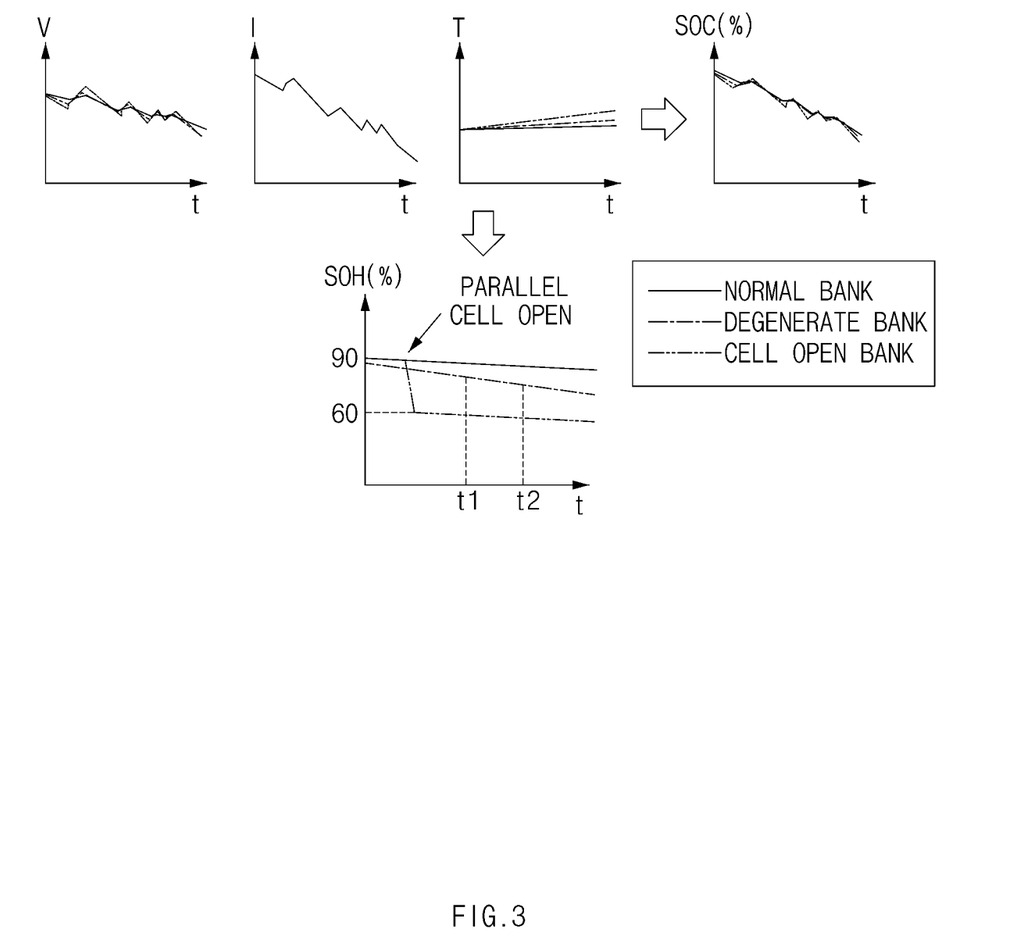
FIG. 3 is a graph showing a change in SOH for each state of a battery cell.

Referring to FIG. 3, an SOH graph (indicated by a solid line) of a battery module in a normal state, an SOH graph (indicated by a dashed-dotted line) of a battery module in a state including a degenerate battery cell, and an SOH graph (indicated by a dashed-dotted line) of the battery module in the state including the CID open battery cell are shown.

Referring to FIG. 3, it can be seen that the change rate of the SOH graph of the battery module including the degenerate battery cell is greater than the change rate of the SOH graph of the normal battery module over time. In addition, the SOH graph of the battery module including the CID open battery cell shows that the SOH rapidly decreases when the corresponding battery cell is opened. As shown in FIG. 3, for example, when three battery cells are included in the battery module, and one of the battery cells is CID open, the SOH value of the battery module drops to ⅔ of the SOH of the normal battery module.

That is, when the SOH of a specific battery module is more than (1/number of battery cells in the battery module)*100% or more than the SOH of other battery modules, it can be seen that the corresponding battery module includes a CID open battery.

Accordingly, if the SOH change rate of a specific battery module is greater than the first value and less than the second value compared to the SOH change rate of other battery modules, the diagnosis unit 212 diagnoses the specific battery module as including a degenerate battery cell, and if the SOH reduction rate of a specific battery module is (1/number of battery cells in the battery module)*100% or more, the diagnosis unit 212 diagnoses the corresponding battery module as including the CID open battery cell, and the diagnosis unit 212 diagnoses a battery module that does not include a degenerate battery cell or a CID open battery cell as a normal state.

The communication unit 214 receives degenerate battery cell state information or CID open battery cell state information for a specific battery module from the diagnosis unit 212 and transmits it to an upper-level controller (vehicle, etc.).

Figure 4:
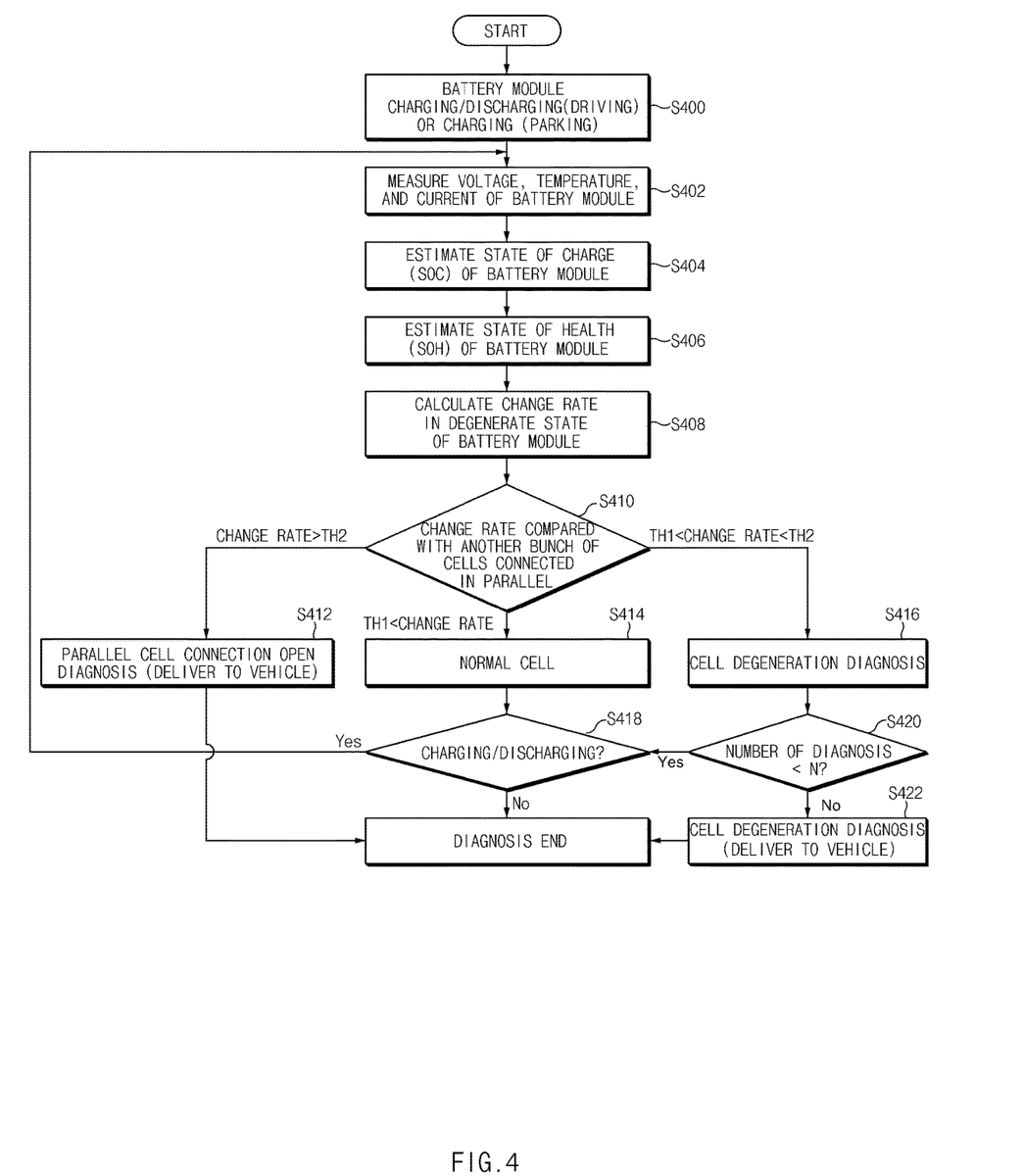
FIG. 4 is a flowchart of a battery management method according to an embodiment of the present invention.

FIG. 4 is a flowchart of a battery management method according to an embodiment of the present invention.

Charging and discharging are performed on a battery module including a plurality of battery cells connected in parallel (S400). For example, when the battery module is included in a battery pack mounted on a vehicle, charging or discharging may be performed while the vehicle is driving. Also, charging may be performed when the vehicle is parked.

Voltage, current, and temperature for the battery module are measured (S402).

The voltage measurement unit 200 measures the voltage at both ends of the battery module. In general, there is a method of measuring a battery voltage, for example, a method of using an operational amplifier and a method of using a relay and a capacitor.

The current measurement unit 202 measures the current of the battery module. In general, battery current measurement may be performed using a current sensor corresponding to at least one of a current transformer method, a hall element method, and a fuse method.

The temperature measurement unit 204 measures the temperature of the battery module. In general, the battery temperature measurement unit may be, for example, a thermistor.

The SOC calculation unit 206 calculates the SOC of the battery module using at least one of voltage, current, or temperature of the battery module (S404). In general, the battery SOC displays the remaining amount of the battery's full charge capacity as a percentage. SOC estimation methods include a current integration method, a method using an EXTENDED KALMAN FILTER, an electric circuit model method, an electrochemical model method, and a data-based method. The SOC calculation unit 206 calculates each SOC for a plurality of battery modules. That is, the SOC calculation unit 206 calculates the SOC of the battery module by using at least one of measured voltage, current, or temperature of a battery module in which a plurality of battery cells are connected in series and/or in parallel.

The SOH calculation unit 208 also calculates the SOH for each of the plurality of battery modules using voltage values, current values, temperature values, and SOCs for each of the plurality of battery modules (S406).

SOH represents the degree of deterioration of battery capacity due to aging. SOH can be used to adjust the charging/discharging capacity according to the battery replacement time and battery usage period. SOH estimation methods include a method of integrating battery charge/discharge current and a method of estimating using the estimated SOC, and in the present invention, a method of estimating an SOH using an SOC is used. A specific method is a known technique and a detailed description thereof will be omitted.

The diagnosis unit 212 receives SOH information of each of the plurality of battery modules from the storage unit 210. The diagnosis unit 212 calculates the change rate of the SOH of each of the plurality of battery modules (S408).

Subsequently, the diagnosis unit 212 calculates a change rate of the SOH of each of the plurality of battery modules, and diagnoses the state of the battery module using the calculated SOH change rate (S410).

Specifically, if the SOH change rate of a specific battery module is greater than the first value and less than the second value compared to the SOH change rate of other battery modules, the specific battery module is diagnosed as including a degenerate battery cell (S416), and if the SOH reduction rate of a specific battery module is (1/the number of battery cells in the battery module)*100% or more (i.e., if it is more than the second value), the battery module is diagnosed as including the CID open battery cell (S412), and a battery module that does not include degenerate battery cells or does not include CID open battery cells (i.e., if it is less than or equal to the first value) is diagnosed as a normal state (S414).

If it is determined that the SOH change rate of a specific battery module is more than the second value (S412), the communication unit 214 receives CID open battery cell state information for a specific battery module from the diagnosis unit 212 and transmits it to an upper-level controller (vehicle, etc.).

In addition, if it is determined that the SOH change rate of a specific battery module is less than the first value (S416), the diagnosis unit 212 determines whether the number of times a specific battery module is diagnosed including a degenerate battery cell is less than a preset number (S420).

If the number of diagnoses with degenerate battery cells is more than the preset number, the vehicle transmits information indicating that the battery module includes the degenerate battery cell to the upper-level controller (vehicle) (S422).

If the number of diagnosis with degenerate battery cells is less than the preset number, the diagnosis unit 212 determines whether the battery module is being charged or discharged (S418), and if it is being charged and discharged, the process starts again from operation S402, and if it is not being charged or discharged, the cell is determined to be a normal cell and the diagnosis is terminated.

Figure 5:
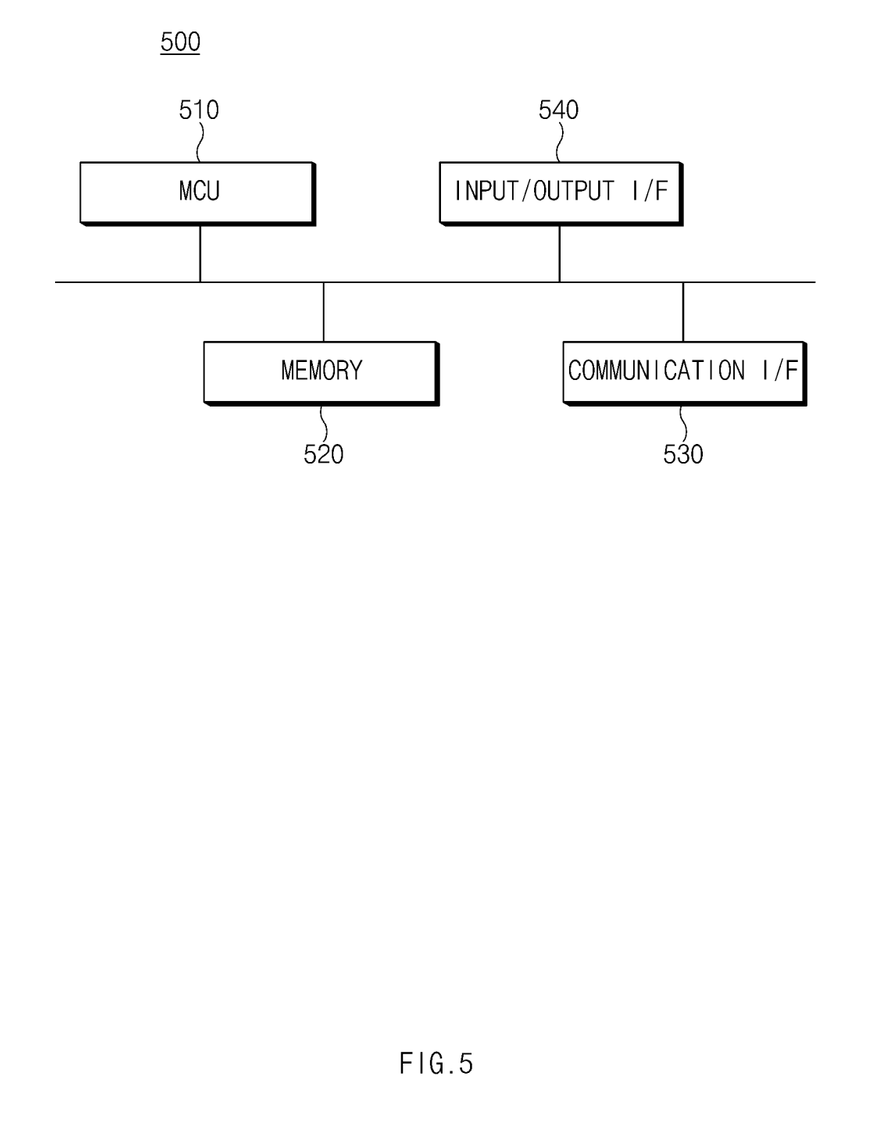
FIG. 5 is a block diagram illustrating a hardware configuration of a battery management system according to an embodiment of the present invention.

FIG. 5 is a block diagram illustrating a hardware configuration of a battery management system according to an embodiment of the present invention.

A battery management system 500 may include a microcontroller unit (MCU) 510 for controlling various processes and components, a memory 520 in which an operating system program and various programs (for example, a battery pack abnormality diagnosis program or a battery pack temperature estimation program) are recorded, an input/output interface 530 for providing an input interface and an output interface between the battery cell module and/or the semiconductor switching element, and a communication interface 540 capable of communicating with the outside through a wired or wireless communication network. As described above, the computer program according to the present invention may be recorded in the memory 520 and processed by the microcontroller 510 to be implemented as a module for performing the respective functional blocks shown in FIG. 2.

In the above, even though all the components constituting the embodiments of the present invention are described as being combined into one or operating in combination, the present invention is not necessarily limited to these embodiments. That is, within the scope of the object of the present invention, all of the constituent elements may be selectively combined and operated in one or more.

In addition, the terms "include", "compose", or "have" as described above means that the corresponding component can be intrinsic, unless otherwise stated, so that it should be interpreted that other components may be further included, not excluded. All terms, including technical or scientific terms, can be interpreted as having the same meaning as generally understood by a person skilled in the art to which the present invention belongs, unless otherwise defined. Generally used terms, such as predefined terms, should be interpreted as being consistent with the contextual meaning of the related art, and are not to be interpreted in an ideal or excessively formal sense, unless explicitly defined in the present invention.

The above description is merely illustrative of the technical idea of the present invention, and those skilled in the art to which the present invention pertains will be able to make various modifications and variations without departing from the essential characteristics of the present invention. Therefore, the embodiments disclosed in the present invention are not intended to limit the technical spirit of the present invention, but to explain, and the scope of the technical spirit of the present invention is not limited by these embodiments. The scope of protection of the present invention should be construed according to the following claims, and all technical ideas falling within the scope of the same shall be construed as falling within the scope of the present invention.

The invention claimed is:

1. A battery management apparatus comprising:
   memory including one or more programs; and
   a controller configured to process the one or more programs of the memory to:
   calculate a state of charge (SOC) of a first battery module based on at least one of a measured voltage, a measured current, or a measured temperature of the first battery module, wherein the first battery module includes a plurality of battery cells connected in parallel;
   calculate a state of health (SOH) of the first battery module based on at least one of the calculated SOC the measured voltage, the measured current, and the measured temperature of the first battery module;
   calculate an SOH change rate of the SOH; and
   determine whether the first battery module is in one of a first state, a second state or a third state based on the calculated SOH change rate, wherein the first state indicates that the first battery module is in a normal state, the second state indicates that the battery module includes a degenerate battery cell, and the third state indicates that the battery module includes a current interrupt device (CID) open battery cell.

2. The battery management apparatus of claim 1, wherein the controller is configured to:
   calculate an SOC of each of a plurality of battery modules including the first battery module based on at least one of a respective voltage, current, and temperature of each of the plurality of battery modules;
   calculate an SOH of each of the plurality of battery modules based on a respective SOC of each of the plurality of battery modules;
   calculate a respective SOH change rate of each of the calculated SOHs; and
   determine whether the first battery module is in the first state, the second state or the third state by comparing the respective SOH change rates of the plurality of battery modules.

3. The battery management apparatus of claim 2, wherein the controller is configured to determine whether the first battery module is in the first state, the second state or the third state by comparing a preset value with the SOH change rate of other ones of the plurality of battery modules with respect to the SOH change rate of the first battery module among change rates of each SOH of the plurality of battery modules during a predetermined time.

4. The battery management apparatus of claim 3, wherein the controller is configured to:
   determine that the first battery module is in the second state in response to the SOH change rate of the at least one battery module being greater than a first preset value and less than a second preset value, as opposed to the SOH change rate of the other ones of the plurality of battery modules, the diagnosis unit;
   determine that the first battery module is in the third state in response to an SOH reduction rate of the at least one battery module being (1/number of battery cells in the battery module)* 100% or more; and
   determine that the first battery module is in the first state in response to the first battery module not including a degenerate battery cell or including a CID open battery cell.

5. The battery management apparatus of claim 4, wherein the memory is further configured to store each respective SOH value calculated for the plurality of battery modules.

6. The battery management apparatus of claim 4, further comprising a communication interface configured to transmit a diagnosis result to an upper-level system in response to the first battery module being determined to be in the second or third state.

7. A battery management method comprising:
   calculating an SOC of a first battery module based on at least one of a measured voltage, a measured current, and a measured temperature of the first battery module, wherein the first battery module includes a plurality of battery cells connected in parallel;

calculating an SOH of the first battery module based on at least one of the calculated SOC, the measured voltage, the measured current, or the measured temperature of the first battery module;

calculating an SOH change rate of the SOH of the battery module; and determining whether the first battery module is in one of a first state, a second state or a third state based on the calculated SOH change rate, wherein the first state indicates that the first battery module is in a normal state, the second state indicates that the battery module includes a degenerate battery cell, and the third state indicates that the battery module includes a CID open battery cell.

8. The method of claim 7, further comprising:

calculating an SOC of each of a plurality of battery modules including the first battery module based on at least one of a respective voltage, current, or temperature of each of the plurality of battery modules; and calculating a respective SOH change rate of each of the calculated SOHs.

9. The method of claim 8, further comprising diagnosing the state of first battery module of the plurality of battery modules by comparing the respective SOH change rates of the plurality of battery modules.

10. The method of claim 9, wherein diagnosing of the state of the first battery module comprises:

determining that the first battery module is in the second state in response to the SOH change rate of the at least one battery module being greater than a first value and less than a second value, as opposed to the SOH change rate of other ones of the plurality of battery modules;

determining that the first battery module is in the third state in response to an SOH reduction rate of the first battery module being (1/number of battery cells in the battery module)* 100% or more; and determining that the first battery module is in the first state in response to the first battery module not including a degenerate battery cell or including a CID open battery cell.

11. The method of claim 8, further comprising storing each SOH value calculated for the plurality of battery modules.

12. The method of claim 10, further comprising transmitting a diagnosis result to an upper-level system in response to the state of the first battery module being in the third state.

13. The method of claim 10, further comprising transmitting a diagnosis result to an upper-level system in response to the state of the first battery module being diagnosed as including a degenerate battery cell and a number of corresponding diagnosis results being greater than or equal to a preset number.

* * * * *